United States Patent
Tanibuchi

(10) Patent No.: US 10,202,688 B2
(45) Date of Patent: Feb. 12, 2019

(54) COATED TOOL AND CUTTING TOOL

(71) Applicant: KYOCERA Corporation, Kyoto-shi, Kyoto (JP)

(72) Inventor: Takahito Tanibuchi, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 112 days.

(21) Appl. No.: 15/126,389

(22) PCT Filed: Mar. 23, 2015

(86) PCT No.: PCT/JP2015/058758
§ 371 (c)(1),
(2) Date: Sep. 15, 2016

(87) PCT Pub. No.: WO2015/146918
PCT Pub. Date: Oct. 1, 2015

(65) Prior Publication Data
US 2017/0081760 A1 Mar. 23, 2017

(30) Foreign Application Priority Data
Mar. 22, 2014 (JP) .................. 2014-059366

(51) Int. Cl.
*B23B 27/14* (2006.01)
*C23C 16/40* (2006.01)
(Continued)

(52) U.S. Cl.
CPC .......... *C23C 16/403* (2013.01); *B23B 27/148* (2013.01); *C23C 16/36* (2013.01);
(Continued)

(58) Field of Classification Search
USPC .................. 51/307, 309; 428/698, 701, 702
See application file for complete search history.

(56) References Cited

U.S. PATENT DOCUMENTS

| 6,187,421 B1 | 2/2001 | Moriguchi et al. |
| 2006/0141271 A1 | 6/2006 | Ruppi |

(Continued)

FOREIGN PATENT DOCUMENTS

| EP | 0965404 A1 | 12/1999 |
| EP | 1655392 A1 | 5/2006 |

(Continued)

OTHER PUBLICATIONS

International Search Report, PCT/JP2015/058758, dated Jun. 9, 2015, 2 pgs.

*Primary Examiner* — Archene A Turner
(74) *Attorney, Agent, or Firm* — Volpe and Koenig, P.C.

(57) ABSTRACT

A coated tool includes a base body and a coating layer located on a surface of the base body. The coating layer includes at least a titanium carbonitride layer and an aluminum oxide layer having an α-type crystal structure. In an X-ray diffraction analysis of the aluminum oxide layer, peaks related to $Al_2O_3$ appear in a wavenumber range of 416-425 $cm^{-1}$(around 420 $cm^{-1}$) of a Raman spectrum obtainable by irradiating an Ar laser beam having a wavelength of 514.53 nm from a cross section of the aluminum oxide layer. When a base body-side peak to be detected by measurement at the base body side portion of the aluminum oxide layer is compared with a surface-side peak to be detected by measurement at the surface side-portion of the aluminum oxide layer, the peak is located at a wavenumber on a lower angle side than the peak.

9 Claims, 3 Drawing Sheets

(51) Int. Cl.
   *C23C 16/36* (2006.01)
   *C23C 28/04* (2006.01)
   *C23C 28/00* (2006.01)
(52) U.S. Cl.
   CPC .......... *C23C 28/044* (2013.01); *C23C 28/347* (2013.01); *B23B 2224/04* (2013.01); *B23B 2224/32* (2013.01); *B23B 2228/10* (2013.01)

(56) References Cited

U.S. PATENT DOCUMENTS

| 2006/0199026 | A1* | 9/2006 | Ruppi | C23C 16/029 |
| | | | | 428/701 |
| 2008/0187775 | A1 | 8/2008 | Ruppi et al. | |
| 2009/0061091 | A1 | 3/2009 | Ruppi | |
| 2010/0139472 | A1 | 6/2010 | Sundstrom et al. | |
| 2010/0232892 | A1 | 9/2010 | Sundstrom et al. | |
| 2016/0201192 | A1 | 7/2016 | Tanibuchi et al. | |

FOREIGN PATENT DOCUMENTS

| EP | 1953269 | A1 | | 8/2008 |
| EP | 3040143 | A1 | | 7/2016 |
| JP | 09-125250 | A | | 5/1997 |
| JP | 2000-141107 | A | | 5/2000 |
| JP | 2008-238393 | A | | 10/2008 |
| JP | 2009-202264 | | * | 9/2009 |
| JP | 2011-068960 | | * | 4/2011 |
| JP | 2011-122222 | A | | 6/2011 |
| JP | 2011-230221 | A | | 11/2011 |
| JP | 2012-071396 | A | | 4/2012 |
| WO | 2008/094104 | A1 | | 8/2008 |
| WO | 2008/094105 | A1 | | 8/2008 |
| WO | 2015/030073 | A1 | | 3/2015 |

* cited by examiner

COATED TOOL AND CUTTING TOOL

TECHNICAL FIELD

The present invention relates to a coated tool and a cutting tool, each having a coating layer on a surface of a base body.

BACKGROUND ART

Coated tools, such as cutting tools, have conventionally been known in which one or more of a titanium carbide layer, a titanium nitride layer, a titanium carbonitride layer, an aluminum oxide layer, a titanium aluminum nitride layer, or the like are deposited on a surface of a base body of cemented carbide, cermet, ceramics, or the like.

With the recent trend in higher efficiency of a cutting process, the cutting tools have a greater opportunity to be used for heavy intermittent cutting or the like, during which a large impact is exerted on a cutting edge. Under these severe cutting conditions, there is a demand for improving fracture resistance in order to inhibit chipping and peeling off of the coating layer due to the large impact exerted on the coating layer. There is also a demand for long time use by ensuring that the coating layer is less apt to wear.

Patent Documents 1 and 2 respectively disclose coated tools having an aluminum oxide layer deposited on a surface of a base body. Patent Document 1 discloses a coating layer. The coating film has cracks, and average crack interval in the aluminum oxide layer is made larger than average crack intervals in a titanium carbonitride film located thereunder. Patent Document 2 discloses an alumina film that is rich in κ-type aluminum oxide on the base body-side and is rich in α-type aluminum oxide on the surface-side of the aluminum oxide layer.

PRIOR ART DOCUMENTS

Patent Documents

Patent Document 1: Japanese Patent Publication No. 2000-141107; and
Patent Document 2: Japanese Unexamined Patent Publication No. 9-125250

SUMMARY OF THE INVENTION

Problems to be Solved by the Invention

The present invention aims at further improving the wear resistance of the aluminum oxide layer and further improving the adhesion of the aluminum oxide layer with respect to the coated tools described in Patent Documents 1 and 2.

Means for Solving the Problems

A coated tool of an embodiment includes a base body and a coating layer located on a surface of the base body. The coating layer includes at least a titanium carbonitride layer and an aluminum oxide layer having an α-type crystal structure, and the titanium carbonitride layer is located closer to the base body than the aluminum oxide layer. Of peaks related to $Al_2O_3$ appearing in a wavenumber range of 416-425 $cm^{-1}$ (around 420 $cm^{-1}$) of a Raman spectrum obtainable by irradiating an Ar laser beam having a wavelength of 514.53 nm to the aluminum oxide layer in a cross section of the coated tool, a base body-side peak to be detected by measurement at a base body-side portion of the aluminum oxide layer is taken as "p", and a surface-side peak to be detected by measurement at a surface-side portion of the aluminum oxide layer is taken as "q". When a comparison is made between "p" and "q", the peak "q" is located at a wavenumber on a lower angle side than the peak "p".

A cutting tool of an embodiment includes a rake surface, a flank surface, and a cutting edge located along an intersecting ridge of the rake surface and the flank surface. At least the rake surface is located on the coating layer of the coated tool. When the surface-side peak at a position being 100 μm away from the cutting edge of the rake surface is taken as q1, and the surface-side peak at a position being within 10 μm from the cutting edge of the rake surface is taken as q2, the peak q1 is located at a wavenumber on a lower angle side than the peak q2.

EFFECTS OF THE INVENTION

With the present embodiment, when the surface-side peak "q" in the Raman spectrum is located at a wavenumber on a low angle side in the surface-side of the aluminum oxide layer, fracture resistance of aluminum oxide crystals is improved, and the aluminum oxide crystals are less apt to fall off, thereby making it possible to inhibit the progress of wear. When the base body-side peak "p" is located at a wavenumber on a high angle side, the orientations of the aluminum oxide crystals become random, and the adhesion between the aluminum oxide layer and the layer located thereunder is enhanced. Accordingly, separation resistance of the aluminum oxide layer with respect to the lower layer is improved, thereby reducing chipping of the aluminum oxide layer. This contributes to improving the wear resistance and fracture resistance of the aluminum oxide layer.

EMBODIMENTS FOR CARRYING OUT THE INVENTION

Figure 1:
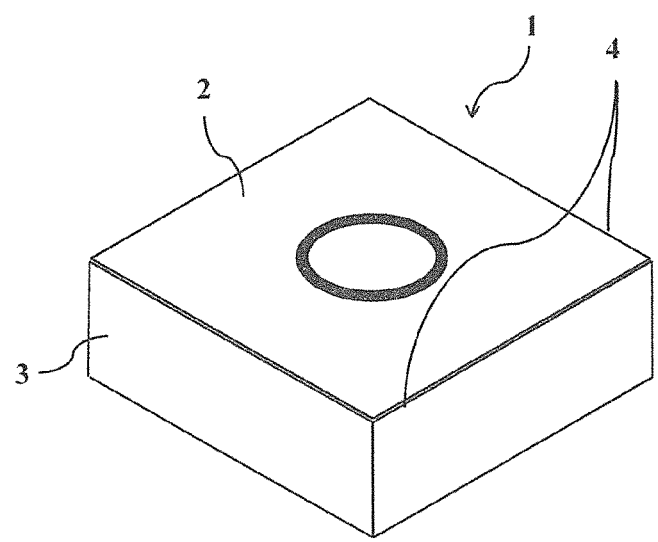
FIG. 1 is a schematic perspective view of an embodiment of a cutting tool according to the present invention.

In a cutting tool that shows one practical form of a coated tool of an embodiment (hereinafter referred to simply as "tool") 1, as shown in FIG. 1, one major surface of the tool 1 serves as a rake surface 2, and a side surface thereof serves as a flank surface 3. An intersecting ridge line formed by the rake surface 2 and the flank surface 3 serves a cutting edge 4.

Figure 2:
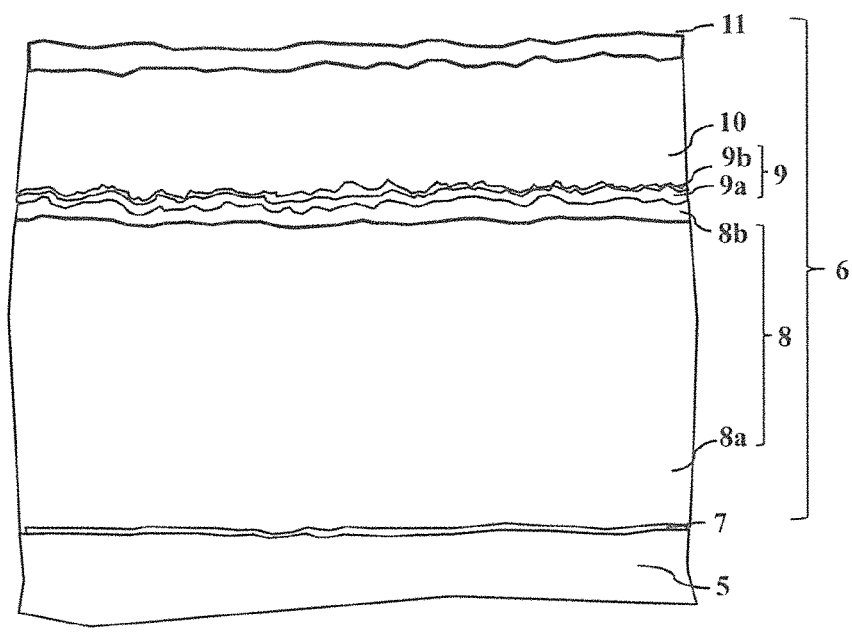
FIG. 2 is a schematic sectional view of the cutting tool in FIG. 1.

As shown in FIG. 2, at least the rake surface 2 of the tool 1 is located on a base body 5 and a surface of a coated layer 6 located on a surface of the base body 5. The coating layer 6 is one in which a lower layer 7, a titanium carbonitride layer 8, an intermediate layer 9, an aluminum oxide layer 10, and a surface layer 11 are laminated one upon another in this order from the base body 5 side. Specifically, the titanium carbonitride layer 8 is located closer to the base body 5 than the aluminum oxide layer 10. The aluminum oxide layer 10 has an α-type crystal structure. The lower layer 7, the intermediate layer 9, and the surface layer 11 are omittable. The lower layer 7 preferably has a thickness of 0.2-1.0 μm. The titanium carbonitride layer 8 preferably has a thickness of 3.0-15.0 μm. The intermediate layer 9 preferably has a thickness of 0.1-1.0 μm. The aluminum oxide layer 10 preferably has a thickness of 2.0-10.0 μm. The surface layer 11 preferably has a thickness of 0.2-1.0 μm.

Figure 3:
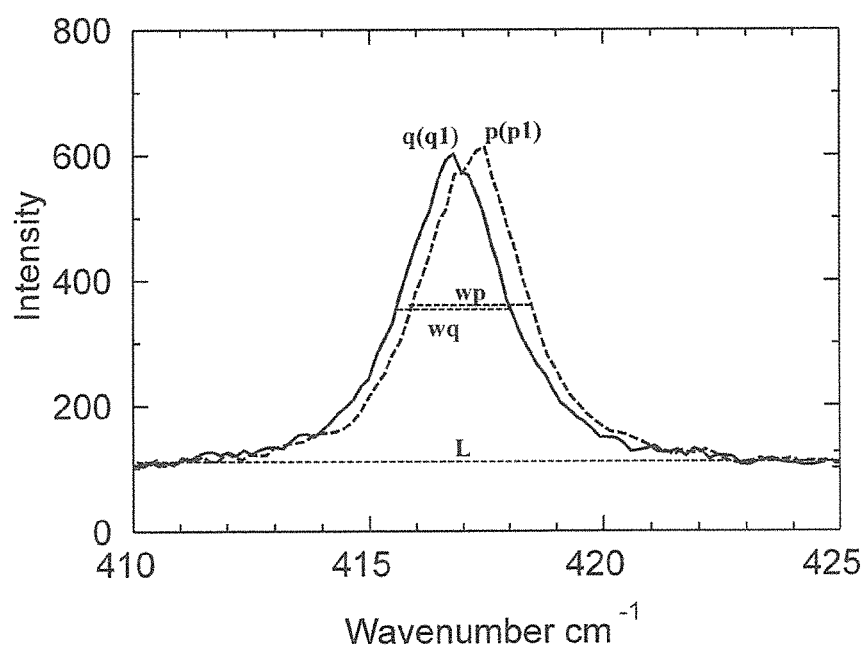
FIG. 3 is a Raman spectrum obtainable by irradiating an Ar laser beam having a wavelength of 514.53 nm to a base body-side portion of an aluminum oxide layer and to a surface-side portion thereof in a cross section of the cutting tool in FIG. 2.

Of peaks related to $Al_2O_3$ appearing in a wavenumber range of 416-425 $cm^{-1}$ (around 420 $cm^{-1}$) of a Raman spectrum obtainable by irradiating an Ar laser beam having a wavelength of 514.53 nm to the aluminum oxide layer 10 in a cross section of the tool 1 in the present practical form, a base body-side peak to be detected by measurement at the base body 5 side portion of the aluminum oxide layer 10 is taken as "p", and a surface-side peak to be detected by measurement in the surface-side portion of the aluminum oxide layer 10 is taken as "q". When a comparison is made between "p" and "q", the peak "q" is located at a wavenumber on a lower angle side than the peak "p" as shown in FIG. 3.

Consequently, on the surface-side of the aluminum oxide layer 10, fracture resistance of aluminum oxide crystals on the surface-side of the aluminum oxide layer 10 can be improved, thereby inhibiting the progress of wear due to falling off of the aluminum oxide crystals. On a side of the aluminum oxide layer 10 which is close to the base body 5, adhesion to the titanium carbonitride layer 8 and the intermediate layer 9, each being located thereunder, can be improved, thereby inhibiting peeling off of the aluminum oxide layer 10. This leads to improved wear resistance and fracture resistance of the aluminum oxide layer 10.

A satisfactory balance between the wear resistance and facture resistance of the aluminum oxide layer 10 is achieved when a difference in position between the peak "q" and the peak "p" is 1.0-3.0 $cm^{-1}$.

In the measurement of the Raman spectrum, the measurement is basically made by setting the irradiation region of the Ar laser beam to 2.0 μmφ. However, when the aluminum oxide layer 10 has a thickness of 4.0 μm or less, the measurement is basically made by setting a diameter of the irradiation region to a half of the thickness of the aluminum oxide layer 10. The measurement is basically made by setting the irradiation region so that an end portion of the irradiation region corresponds to an end portion of the aluminum oxide layer 10. Depending on performance of a measuring device, when the irradiation region is larger than the half of the thickness of the aluminum oxide layer 10, an upper end of the irradiation region is aligned with an intermediate position of the thickness of the aluminum oxide layer, and the measurement is made in a state in which a part of the irradiation region extends beyond the aluminum oxide layer 10. Although a measurement unit (resolution) of the wavenumber in the measurement of the Raman spectrum is basically 0.1 $cm^{-1}$, it may be 0.5 $cm^{-1}$ for a simplified measurement thereof.

The measurement of the Raman spectrum of the aluminum oxide layer 10 is basically made on a cross section of the tool 1 including the coating layer. The cross section of the tool 1 is brought into a mirror-finished surface by using diamond abrasive grains having a mean particle size of 0.5 μm. On this occasion, the cross section is processed into a mirror surface because the positions of the peak "q" and the peak "p" may change when the processed cross section has polishing flaws.

When measuring the Raman spectrum of the tool 1, the measurement is made at a position being 100 μm away from the cutting edge 4 of the rake surface 2 (referred to as "a rake surface-side position") in the present embodiment. The measurement is also made at a position being within 10 μm from the cutting edge 4 of the rake surface 2 (referred to as "a cutting edge-side position") in the present embodiment. A base body-side peak at the rake surface-side position is taken as p1, a surface-side peak at the rake surface-side position is taken as q1, a base body-side peak at the cutting edge-side position is taken as p2, and a surface-side peak at the cutting edge-side position is taken as q2.

When the peak q1 is located at a wavenumber on a lower angle side than the peak q2, the wear resistance of the coating layer 6 can be enhanced thereby to reduce crater wear on the rake surface 2 through which chips pass, and chipping resistance of the coating layer 6 in the cutting edge can also be improved. Here, when a difference between a wavenumber of the peak q1 and a wavenumber of the peak q2 is 0.5-3.0 $cm^{-1}$, it is possible to inhibit the progress of crater wear in the rake surface 2 and also improve the chipping resistance in the cutting edge 4.

When the peak q2 is located on a lower angle side than the peak p2 and a difference between the wavenumber of the peak p2 and the wavenumber of the peak q2 is 0.5-3.0 $cm^{-1}$, both the wear resistance and chipping resistance in the cutting edge 4 can be enhanced.

When the peak p1 is located on a lower angle side than the peak p2 and a difference between the wavenumber of the peak p1 and the wavenumber of the peak p2 is less than 1.0 $cm^{-1}$, it is possible to improve the adhesion of the coating layer 6 at the rake surface-side position and the cutting edge-side position.

Also in the present practical form, a half width wq of the peak "q" is smaller than a half width wp of the peak "p". This contributes to reducing proportions of dislocations and defects in the aluminum oxide crystals, and also contributes to aligning the orientations of the aluminum oxide crystals in the surface-side portion of the aluminum oxide layer 10. It is consequently possible to enhance hardness in the surface-side portion of the aluminum oxide layer 10 and enhance the wear resistance of the aluminum oxide layer 10. Compared to the surface-side portion of the aluminum oxide layer 10, the base body-side portion of the aluminum oxide layer 10 has more dislocations and defects of the aluminum oxide crystals, and the orientations of the aluminum oxide crystals are adjusted according to surface irregularities of the intermediate layer 9, the titanium carbonitride layer 8, and the lower layer 7. This leads to enhanced adhesion between the aluminum oxide layer 10 and the intermediate layer 9 located thereunder.

Base lines on the high angle side and the low angle side of the peak "p" and the peak "q" in the wavenumber range of 410-425 $cm^{-1}$ are calculated, and wavenumber widths of peaks at a position of peak intensity that is half of peak intensity of each of the peak "p" and the peak "q" from their respective base lines are respectively taken as the half widths wp and wq. The present invention employs, as the base line, a line (dotted line L in FIG. 3) that connects minimum intensity of the high angle side and minimum intensity of the low angle side with respect to the peak "p" and the peak "q" in the wavenumber range of 410-425 $cm^{-1}$.

With the present practical form, when an XRD base body-side peak to be detected by measurement at the base body 5 side portion of the aluminum oxide layer 10 is compared with an XRD surface-side peak to be detected by measurement at the surface-side portion of the aluminum oxide layer 10 in an X-ray diffraction analysis, in terms of orientation coefficient Tc (116) of the aluminum oxide layer 10 expressed by the following general formula Tc (hkl), a surface-side Tc (116) in the XRD surface-side peak is larger than a base body-side Tc (116) in the XRD base body-side peak.

Orientation Coefficient

Tc(hkl)={I (hkl)/I$_0$(hkl)}/[(1/7)×Σ{I(HKL)/I$_0$(HKL)}], in which (HKL) denotes seven planes of (012), (104), (110), (113), (024), (116), and (124); (hkl) denotes any one of (012), (104), (110), (113), (024), (116), and (124); I(HKL) and I(hkl) denote peak intensity of peaks related to each crystal plane detected in the X-ray diffraction analysis of the aluminum oxide layer; and I$_0$(HKL) and I$_0$(hkl) denote standard diffraction intensity of each crystal plane described on JCPDS card No. 46-1212.

Thus, on the surface-side of the aluminum oxide layer 10, the fracture resistance of the aluminum oxide crystals can be improved, thereby inhibiting the progress of wear due to micro chipping. On the side of the aluminum oxide layer 10 which is close to the base body 5, the adhesion with respect to the titanium carbonitride layer 8 and the intermediate layer 9 that are located thereunder can be improved, thereby inhibiting the peeling off of the aluminum oxide layer 10. It is consequently possible to improve the wear resistance and adhesion of the aluminum oxide layer 10.

A measuring method of the base body-side Tc (116) and the surface-side Tc (116) of the aluminum oxide layer 10 is described below. In the X-ray diffraction analysis of the aluminum oxide layer 10, the measurement is made with a device for the X-ray diffraction analysis using a general CuKα ray. The peak intensity of each crystal plane of the aluminum oxide layer 10 is obtainable from an X-ray diffraction chart by confirming a diffraction angle of each crystal plane described in the JCPDS card No. 46-1212, identifying the crystal plane having a detected peak, and measuring peak intensity thereof.

To measure the surface side Tc (116), peak intensity of the surface-side portion of the aluminum oxide layer 10 is measured. Specifically, the X-ray diffraction analysis of the coating layer 6 is performed in a state in which the surface layer 11 is removed by polishing, or in a state in which the surface layer 11 is not subjected to polishing. The orientation coefficient Tc (hkl) is calculated by measuring peak intensity of each obtained peak. When the surface layer 11 is removed by polishing, a thickness corresponding to 20% or less of the thickness of the aluminum oxide layer 10 may already been removed. Even when the X-ray diffraction analysis is performed in the state in which the surface layer 11 is not polished, seven peaks of aluminum oxide need to be measured.

To measure the base body side Tc(116), peak intensity of the base body-side portion of the aluminum oxide layer 10 is measured. Specifically, the aluminum oxide layer 10 of the coating layer 6 is firstly polished to a predetermined thickness. The polishing is carried out by brush processing using diamond abrasive grains, processing with an elastic grinding wheel, or blast processing. The polishing is also carried out until the aluminum oxide layer 10 has a thickness corresponding to 10-40% of the thickness of the aluminum oxide layer 10 before being polished. Thereafter, the orientation coefficient Tc (hkl) is calculated by subjecting a polished part of the aluminum oxide layer 10 to the X-ray diffraction analysis under the same conditions as the measurement at the surface-side portion of the aluminum oxide layer 10, followed by measuring a peak of the aluminum oxide layer 10.

The surface-side Tc (116) in the XRD surface-side peak of the aluminum oxide layer 10 measured in the foregoing method can be compared with the base body-side Tc (116).

The orientation coefficient Tc is obtainable by a ratio with respect to standard data for non-orientation defined by JCPDS card, and therefore indicates a degree of orientation of each crystal plane.

With the present practical form, I(104) is the strongest and I(116) is the second strongest in the XRD surface-side peaks of the aluminum oxide layer 10. This contributes to reducing the crater wear on the rake surface 2. There is a tendency that flank wear due to micro chipping is reduced on the flank surface 3. A similar effect is obtainable even when I(116) is the strongest and I(104) is the second strongest.

Additionally, with the present practical form, the surface-side Tc (104) in the XRD surface-side peak is larger than the base body-side Tc (104) in the XRD base body-side peak. This is effective in reducing the flank wear on the flank surface 3 and in enhancing the fracture resistance of the rake surface 2, thereby enhancing the fracture resistance of the cutting tool 1. Improvement of chipping resistance of the aluminum oxide layer is insufficient merely by making the surface side Tc (104) larger than the base body-side Tc (104). However, considerable improvement of crater wear resistance of the aluminum oxide layer 10 is attainable by making the surface-side Tc (116) larger than the base body-side Tc (116).

The titanium carbonitride layer 8 contains acetonitrile (CH$_3$CN) gas as a raw material, and is made up of a so-called MT-titanium carbonitride layer 8a composed of columnar crystals deposited at a relatively low deposition temperature of 780-900° C., and a so-called HT-titanium carbonitride layer 8b composed of granular crystals deposited at a high deposition temperature of 950-1100° C. These layers 8a and 8b are deposited in this order from the base body-side. With the present practical form, the surface of the HT-titanium carbonitride layer 8b is provided with protrusions having a shape tapered toward the aluminum oxide layer 10, namely, a triangular shape in a sectional view. This makes it possible to enhance the adhesion with respect to the aluminum oxide layer 10, thereby reducing peeling off and chipping of the coating layer 6.

With the present practical form, the intermediate layer 9 is located on a surface of the HT-titanium carbonitride layer 8b. The intermediate layer 9 contains titanium and oxygen, and is composed of, for example, TiAlCNO, TiCNO, or the like. FIG. 2 shows a lower intermediate layer 9a and an upper intermediate layer 9b, in which these are laminated one upon another. Consequently, aluminum oxide particles constituting the aluminum oxide layer 10 have an α-type crystal structure. The aluminum oxide layer 10 of the α-type crystal structure has high hardness and is capable of enhancing the wear resistance of the coating layer 6. Thus, the intermediate layer 9 has a laminate structure formed of the lower intermediate layer 9a composed of TiAlCNO, and the upper intermediate layer 9b composed of TiCNO, thereby producing effects of enhancing the fracture resistance of the cutting tool 1.

The lower layer 7 and the surface layer 11 are composed of titanium nitride. The lower layer 7 has a thickness of 0.0-1.0 μm. The surface layer 11 has a thickness of 0.0-3.0 μm. Another practical form of the present invention may omit at least one of the lower layer 7 and the surface layer 11.

Thicknesses of the individual layers and properties of crystals constituting these layers are measurable by observing electron micrography (a scanning electron microscope (SEM) photograph or transmission electron microscope (TEM) photograph) in the cross section of the tool 1. In the present invention, a description that "a crystal form of crystals constituting the individual layers of the coating layer 6 is a columnar shape" denotes a state in which a ratio of a mean crystal width of the individual crystals in a width direction of the coating layer 6 to an average length of the crystals in a thickness direction of the coating layer 6 is 0.3 or less in average. One in which the ratio of the mean crystal width of the crystals to the length thereof in the thickness direction of the coating layer exceeds 0.3 in average is defined that the crystal form thereof is a granular shape. The mean crystal width is obtainable by drawing a straight line parallel to the width direction of the coating layer 6 at an intermediate point in the thickness direction thereof, and dividing a length of the straight line that crosses 10 or more crystals by the number of the crystals.

As the base body 5 of the tool 1, there are, for example, cemented carbides and Ti-based cermets obtainable by binding a hard phase composed of tungsten carbide (WC), and, if needed, at least one kind selected from the group consisting of carbides, nitrides, carbonitrides of groups 4, 5, and 6 metals in the periodic table, with a binding phase composed of iron group metal, such as cobalt (Co) and nickel (Ni), or ceramics, such as $Si_3N_4$, $Al_2O_3$, diamond, and cubic boron nitride (cBN). In particular, when the tool 1 is used as a cutting tool, the base body 5 is preferably composed of cemented carbide or cermet in terms of fracture resistance and wear resistance. The base body 5 may be composed of metal, such as carbon steel, high speed steel, and alloy steel, depending on use.

The foregoing cutting tool 1 is intended to perform a cutting process by bringing the cutting edge located along the intersection of the rake surface and the flank surface into contact with a workpiece, and is capable of producing the foregoing excellent effects. The coated tool of the present invention is applicable to, besides the cutting tool 1, a variety of uses, for example, wear resistant components such as sliding components and metal dies, excavating tools, tools such as edged tools, and impact resistant components. Excellent mechanical reliability is also attainable in these uses.

A method of manufacturing the coated tool according to the present invention is described by referring to an example of a method of manufacturing the tool 1.

Firstly, metal powder, carbon powder, or the like is suitably added to inorganic powder, such as metal carbide, nitride, carbonitride, and oxide, each being capable of forming, by sintering, a hard alloy that becomes the base body 5. These are mixed together and then formed into a predetermined tool shape with a known molding method, such as press molding, cast molding, extrusion molding, and cold isostatic press molding, followed by sintering in vacuum or in a non-oxidizing atmosphere, thereby manufacturing the base body 5 composed of the hard alloy. A surface of the base body 5 is then subjected to a polishing process if desired, and a cutting edge part is subjected to a honing process.

Subsequently, a coating layer is deposited on the surface by chemical vapor deposition (CVD) method. Firstly, a mixed gas is prepared which is composed of, as a reaction gas composition, 0.5-10% by volume of titanium tetrachloride ($TiCl_4$) gas, 10-60% by volume of nitrogen ($N_2$) gas, and the rest that is hydrogen ($H_2$) gas. The mixed gas is then loaded into a chamber so as to deposit a TiN layer that is the lower layer 7 at a deposition temperature of 800-940° C. and at 8-50 kPa.

Subsequently, a mixed gas is prepared which is composed of, as a reaction gas composition, 0.5-10% by volume of titanium tetrachloride ($TiCl_4$) gas, 10-60% by volume of nitrogen ($N_2$) gas, 0.1-3.0% by volume of acetonitrile ($CH_3CN$) gas, and the rest that is hydrogen ($H_2$) gas. The mixed gas is then loaded into the chamber so as to form an MT-titanium carbonitride layer at a deposition temperature of 780-880° C. and at 5-25 kPa.

Subsequently, an HT-titanium carbonitride layer constituting an upper part of the titanium carbonitride layer 8 is deposited. Protrusions are formed on the surface of the titanium carbonitride layer 8 by the depositions of the MT-titanium carbonitride layer and the HT-titanium carbonitride layer. In the present practical form, the HT-titanium carbonitride layer is deposited under the following specific deposition conditions. That is, a mixed gas is prepared which is composed of 1.0-4% by volume of titanium tetrachloride ($TiCl_4$) gas, 0.1-10% by volume of methane ($CH_4$) gas, 5-20% by volume of nitrogen ($N_2$) gas, and the rest that is hydrogen ($H_2$) gas. The mixed gas is then loaded into the chamber, and deposition is carried out at 900-1050° C. and 5-40 kPa.

Subsequently, an intermediate layer 9 is deposited. Specific deposition conditions in the present practical form are as follows. As a first stage, a mixed gas is prepared which is composed of 3-10% by volume of titanium tetrachloride ($TiCl_4$) gas, 3-10% by volume of methane ($CH_4$) gas, 5-20% by volume of nitrogen ($N_2$) gas, 0.5-2% by volume of carbon oxide (CO) gas, 0.5-3% by volume of aluminum trichloride ($AlCl_3$) gas, and the rest that is hydrogen ($H_2$) gas. The mixed gas is then loaded into the chamber, and deposition is carried out at a deposition temperature of 900-1050° C. and at 5-40 kPa.

Subsequently, as a second stage for the intermediate layer 9, a mixed gas is prepared which is composed of 1-3% by volume of titanium tetrachloride ($TiCl_4$) gas, 1-3% by volume of methane ($CH_4$) gas, 5-20% by volume of nitrogen ($N_2$) gas, 2-5% by volume of carbon oxide (CO) gas, and the rest that is hydrogen ($H_2$) gas. The mixed gas is then loaded into the chamber, and deposition is carried out at a deposition temperature of 900-1050° C. and at 5-40 kPa. The nitrogen ($N_2$) gas may be changed to argon (Ar) gas in the above process.

Subsequently, an α aluminum oxide layer 10 is deposited. As a deposition method for the α aluminum oxide layer 10, firstly, deposition is carried out using a mixed gas composed of 0.5-5.0% by volume of aluminum trichloride ($AlCl_3$) gas, 0.5-3.5% by volume of hydrogen chloride (HCl) gas, and the rest that is hydrogen ($H_2$) gas at 950-1100° C. and 5-10 kPa. Then, deposition is carried out using a mixed gas composed of 0.5-5.0% by volume of carbon dioxide ($CO_2$) gas, and the rest that is nitrogen ($N_2$) gas at 950-1100° C. and 5-10 kPa. In the above first stage of deposition, a nucleus of aluminum oxide to be deposited as the α aluminum oxide layer 10 is generated, and a position of a peak "p" in a Raman spectrum is controlled by controlling a generation state of the nucleus.

Subsequently, an aluminum oxide layer 10 is deposited using a mixed gas composed of 0.5-10.0% by volume of aluminum trichloride ($AlCl_3$) gas, 0.5-5.0% by volume of hydrogen chloride (HCl) gas, 0.5-5.0% by volume of carbon dioxide ($CO_2$) gas, 0.0-0.5% by volume of hydrogen sulfide ($H_2S$) gas, and the rest that is hydrogen ($H_2$) gas at 950-1100° C. and 5-10 kPa. On this occasion, a flow rate of the $CO_2$ gas is held constant with the passage of deposition time of the aluminum oxide layer 10, while a flow rate of the $AlCl_3$ gas and a flow rate of the $H_2S$ gas are enhanced continuously or stepwise. Thereby, a ratio of reaction routes is changed so as to change a growth state of aluminum oxide crystals, thus ensuring that a peak "q" is located closer to the lower angle side than the peak "p" in the Raman spectrum.

A surface layer (TiN layer) 11 is then deposited as needed. Specific deposition conditions are as follows. A mixed gas is prepared which is composed of, as a reaction gas composition, 0.1-10% by volume of titanium tetrachloride ($TiCl_4$) gas, 10-60% by volume of nitrogen ($N_2$) gas, and the rest that is hydrogen ($H_2$) gas. The mixed gas is then loaded into the chamber, and deposition is carried out at a deposition temperature of 960-1100° C. and at 10-85 kPa.

Thereafter, at least a cutting edge part of the surface of the deposited coating layer 6 is subjected to a polishing process as needed. The polishing process makes the cutting edge part smooth and inhibits welding of a workpiece, resulting in the tool with more excellent fracture resistance.

EXAMPLES

Firstly, 6% by mass of metal cobalt powder having a mean particle size of 1.2 µm, 0.5% by mass of titanium carbide powder having a mean particle size of 2.0 µm, 5% by mass of niobium carbonate powder, and the rest that was tungsten carbide powder having a mean particle size of 1.5 µm were added and mixed together and then molded into a tool shape (CNMG120408) by press molding. Subsequently, this was subjected to debindering and sintered at 1500° C. in vacuum of 0.01 Pa for one hour, thereby manufacturing a base body composed of cemented carbide. The manufactured base body is then subjected to brushing, and a part thereof serving as a cutting edge was subjected to round honing.

Subsequently, a tool was manufactured by depositing a coating layer on the base body of cemented carbide by chemical vapor deposition (CVD) method under deposition conditions in Table 1. In Tables 1 to 4, compounds are respectively indicated by chemical symbols. In Samples Nos. 3 and 10 in Table 2, the composition of the mixed gas is continuously changed from the beginning of deposition to the termination of deposition. When a mixing ratio of gases having different compositions is "x"% by volume at the beginning of deposition and "y"% by volume at the termination of deposition, this is indicated by "x→y".

Although not presented in Tables 1 and 2, in Samples Nos. 1 to 7, when depositing the aluminum oxide layer, deposition was carried out firstly using a mixed gas composed of 3.0% by volume of aluminum trichloride ($AlCl_3$) gas, 1.5% by volume of hydrogen chloride (HCl) gas, and the rest that was hydrogen ($H_2$) gas under conditions of 1000° C. and 7 kPa, and subsequently deposition was carried out using a mixed gas composed of 2.0% by volume of carbon dioxide ($CO_2$) gas, and the rest that was nitrogen ($N_2$) gas under conditions of 1000° C. and 7 kPa, thereby depositing the intermediate layer. Thereafter, the first stage deposition was carried out to form the nucleus of the aluminum oxide layer. In Sample No. 10, when depositing the aluminum oxide layer, the first stage deposition was carried out firstly using a mixed gas composed of 22.0% by volume of aluminum trichloride ($AlCl_3$) gas, 37% by volume of carbon dioxide ($CO_2$) gas, and the rest that was nitrogen ($N_2$) gas under conditions of 1150° C. and 0.2 kPa, thereby depositing the intermediate layer. Thereafter, the nucleus of the aluminum oxide layer was formed. Samples Nos. 8 and 9 were obtained without the step of forming the nucleus.

In Samples Nos. 1 to 8, firstly, a Raman spectrum was obtained by irradiating an Ar laser beam having a wavelength of 514.53 nm in an irradiation range of 2.0 µmφ to the aluminum oxide layer on a processed surface which was obtained by carrying out mirror finish of a cross section of the tool including a flat portion of the flank surface. The obtained Raman spectrum was measured at a base body-side portion and at a surface-side portion of the processed surface. Base body-side peaks p1 and p2 and surface-side peaks q1 and q2 in peaks related to $Al_2O_3$ that appeared in a wavenumber range of 416-425 $cm^{-1}$ (around 420 $cm^{-1}$) of the Raman spectrum, and half widths wp and wq were measured. The results together with a difference in wavelength between p and q (p–q difference) were presented in Table 3.

The flat surface of the flank surface was subjected to an X-ray diffraction analysis using a CuKα ray from the surface of the coating layer. Identification of XRD surface-side peaks in the surface-side portion of the aluminum oxide layer (indicated by "surface-side" in Table) was carried out, and peak intensity of each of the peaks was measured. Here it was confirmed that 80% or more of the thickness of the aluminum oxide layer was ensured. Subsequently, polishing was carried out until reaching a thickness corresponding to 10-40% of the thickness of the aluminum oxide layer. Similarly, by the X-ray diffraction analysis, identification XRD base body-side peaks in the base body-side portion of the aluminum oxide layer (indicated by "base body-side" in Table) was carried out, and peak intensity of each of the peaks was measured. Orientation coefficient Tc of each of crystal planes of (116) plane, (104) plane, (110) plane, and (012) plane was calculated using the obtained peak intensities of the peaks. With a scanning electron microscope (SEM), a fracture surface of the tool was observed to measure a thickness of each layer. The results were presented in Tables 2 to 5.

Wear resistance and fracture resistance were evaluated by conducting a continuous cutting test and an intermittent cutting test using Samples Nos. 1 to 7 according to the present invention and Samples Nos. 8 to 10 that were comparative examples under the following conditions. The results were presented in Table 5.

(Continuous Cutting Conditions)

Workpiece: Chromium molybdenum steel (SCM435)

Tool shape: CNMG120408

Cutting speed: 300 m/min

Feed rate: 0.3 mm/rev

Depth of cut: 1.5 mm

Cutting time: 25 min

Others: Using water soluble cutting fluid

Evaluated items: With the scanning electron microscope, a honed cutting edge portion was observed to measure an amount of flank wear in a direction vertical to the rake surface in an actually worn portion, as well as crater wear on the rake surface.

(Intermittent Cutting Conditions)

Workpiece: Chromium molybdenum steel with four grooves (SCM440)

Tool shape: CNMG120408

Cutting speed: 300 m/min

Feed rate: 0.3 mm/rev

Depth of cut: 1.5 mm

Others: Using water soluble cutting fluid

Evaluated item: The number of impacts before a fracture occurred

TABLE 1

| Coating layer | Mixed gas composition (% by volume) | Chamber temperature (° C.) | Pressure (kPa) |
|---|---|---|---|
| TiN-1 | $TiCl_4$: 2.5, $N_2$: 23, $H_2$: balance | 900 | 16 |
| TiCN-1(MT) | $TiCl_4$: 1.0, $N_2$: 10, $CH_3CN$: 0.1, $H_2$: balance | 850 | 9 |
| TiCN-2(HT) | $TiCl_4$: 1.0, $N_2$: 10, $CH_4$: 2.0, $H_2$: balance | 1010 | 9 |
| TiAlCNO-1 | $TiCl_4$: 3.0, $CH_4$: 4.5, $N_2$: 5.0, CO: 0.5, $AlCl_3$: 1.5, $H_2$: balance | 1000 | 15 |
| TiCNO-1 | $TiCl_4$: 3.0, $CH_4$: 2.5, $N_2$: 5.0, CO: 3.0, $H_2$: balance | 1000 | 15 |
| $Al_2O_3$-1 | $AlCl_3$: 2.0, HCl: 2.0, $CO_2$: 1.0, $H_2$: balance | 1000 | 10 |
| $Al_2O_3$-2 | $AlCl_3$: 4.0, HCl: 2.0, $CO_2$: 1.0, $H_2S$: 0.05, $H_2$: balance | 1000 | 10 |
| $Al_2O_3$-3 | $AlCl_3$: 2.5→5.0, HCl: 2.0, $CO_2$: 1.3, $H_2S$: 0.02→0.1, $H_2$: balance | 1000 | 10 |
| $Al_2O_3$-4 | $AlCl_3$: 4.0, HCl: 2.0, $CO_2$: 1.3, $H_2$: balance | 1000 | 10 |
| $Al_2O_3$-5 | $AlCl_3$: 6.0, HCl: 2.0, $CO_2$: 1.3, $H_2S$: 0.4, $H_2$: balance | 1000 | 10 |
| $Al_2O_3$-6 | $AlCl_3$: 4.3, HCl: 2.0, $CO_2$: 3.0, $H_2$: balance | 970 | 20 |
| $Al_2O_3$-7 | $AlCl_3$: 8.0, HCl: 2.0, $CO_2$: 3.0, $H_2S$: 0.7, $H_2$: balance | 1050 | 10 |
| $Al_2O_3$-8 | $AlCl_3$: 7.0→12, HCl: 2.0, $CO_2$: 3.5→6.0, $H_2S$: 0.3→2.0, $H_2$: balance | 990 | 10 |
| $Al_2O_3$-9 | $AlCl_3$: 1.5, HCl: 5.0, $CO_2$: 1.0, $H_2$: balance | 1005 | 6 |
| $Al_2O_3$-10 | $AlCl_3$: 2.0, HCl: 3.0, $CO_2$: 8.0, $H_2S$: 1.0, $H_2$: balance | 1000 | 7 |
| $Al_2O_3$-11 | $AlCl_3$: 4.0, HCl: 5.0, $CO_2$: 3.0, $H_2S$: 0.4, $H_2$: balance | 1005 | 6 |
| $Al_2O_3$-12 | $AlCl_3$: 8.0, HCl: 5.0, $CO_2$: 5.0, $H_2S$: 0.4, $H_2$: balance | 1000 | 7 |
| TiN-2 | $TiCl_4$: 2.0, $N_2$: 44, $H_2$: balance | 1010 | 80 |

*$Al_2O_3$-3, $Al_2O_3$-8:
The addition amount of each gas ($AlCl_3$, $CO_2$, $H_2S$) in the mixed gas was continuously changed from x to y.

TABLE 2

| Sample No | Coating Layer[1] | | | | | | |
|---|---|---|---|---|---|---|---|
| | Lower layer | TiCN layer | | Intermediate layer | | $Al_2O_3$ layer | Surface layer |
| 1 | — | TiCN-1 (9) | TiCN-2 (0.2) | TiAlCNO-1 (0.2) | TiCNO-1 (0.1) | $Al_2O_3$-1 (3) / $Al_2O_3$-2 (5) | TiN-2 (1.0) |
| 2 | TiN-1 (0.5) | TiCN-1 (9) | TiCN-2 (0.5) | TiAlCNO-1 (0.1) | TiCNO-1 (0.1) | $Al_2O_3$-4 (2) / $Al_2O_3$-5 (5) | TiN-2 (2.0) |
| 3 | TiN-1 (0.5) | TiCN-1 (12) | TiCN-2 (0.1) | TiAlCNO-1 (0.05) | TiCNO-1 (0.05) | $Al_2O_3$-3 (7) | TiN-2 (1.5) |
| 4 | TiN-1 (1) | TiCN-1 (8) | TiCN-2 (0.3) | TiAlCNO-1 (0.1) | TiCNO-1 (0.1) | α-$Al_2O_3$-6 (3) / $Al_2O_3$-7 (4) | — |
| 5 | TiN-1 (0.5) | TiCN-1 (6) | TiCN-2 (0.5) | — | TiCNO-1 (0.5) | $Al_2O_3$-3 (9) | TiN-2 (3) |
| 6 | TiN-1 (0.5) | TiCN-1 (10) | TiCN-2 (0.1) | TiAlCNO-1 (0.2) | TiCNO-1 (0.1) | $Al_2O_3$-1 (2) / $Al_2O_3$-11 (5) | TiN-2 (1.5) |
| 7 | TiN-1 (1) | TiCN-1 (8) | TiCN-2 (0.3) | TiAlCNO-1 (0.1) | TiCNO-1 (0.1) | $Al_2O_3$-2 (2) / $Al_2O_3$-12 (5) | TiN-2 (1.0) |
| 8 | TiN-1 (1) | TiCN-1 (6) | TiCN-2 (0.5) | TiAlCNO-1 (0.1) | TiCNO-1 (0.1) | $Al_2O_3$-8 (6) | TiN-2 (1) |
| 9 | TiN-1 (0.5) | TiCN-1 (9) | TiCN-2 (0.1) | TiAlCNO-1 (0.1) | TiCNO-1 (0.1) | $Al_2O_3$-4 (1) / $Al_2O_3$-9 (6) | TiN-2 (0.5) |
| 10 | TiN-1 (0.5) | TiCN-1 (10) | TiCN-2 (0.3) | TiAlCNO-1 (0.1) | TiCNO-1 (0.1) | $Al_2O_3$-10 (8) | TiN-2 (2.0) |

[1]Values in parentheses represent the layer thickness in μm.

TABLE 3

| | Raman spectrum ($cm^{-1}$) | | | | | | | | | |
|---|---|---|---|---|---|---|---|---|---|---|
| | Peak p1 | | Peak q1 | | | | | | | |
| Sample No | Position | Half width wp | Position | Half width wq | p1 − q1 difference | Peak p2 Position | Peak q2 Position | p2 − q2 difference | p2 − p1 difference | q2 − q1 difference |
| 1 | 418.0 | 5.1 | 417.0 | 5.3 | 1.0 | 418.0 | 417.0 | 1.0 | 0.0 | 0.0 |
| 2 | 421.5 | 5.3 | 420.0 | 4.3 | 1.5 | 422.0 | 421.5 | 0.5 | 0.5 | 1.5 |
| 3 | 418.5 | 5.0 | 417.5 | 4.9 | 1.0 | 419.0 | 418.0 | 1.0 | 0.5 | 0.5 |
| 4 | 420.0 | 5.2 | 418.0 | 4.2 | 2.0 | 420.5 | 418.5 | 2.0 | 0.5 | 0.5 |
| 5 | 419.0 | 5.2 | 418.0 | 5.2 | 1.0 | 419.0 | 418.5 | 0.5 | 0.0 | 0.5 |
| 6 | 419.5 | 4.9 | 416.0 | 5.1 | 3.5 | 418.0 | 416.0 | 2.0 | −1.5 | 0.0 |
| 7 | 420.5 | 4.8 | 416.5 | 5.2 | 4.0 | 420.0 | 417.0 | 3.0 | −0.5 | 0.5 |
| 8 | 419.0 | 4.7 | 419.0 | 4.6 | 0.0 | 419.0 | 419.0 | 0.0 | 0.0 | 0.0 |

TABLE 3-continued

| | Raman spectrum (cm$^{-1}$) | | | | | | | | |
|---|---|---|---|---|---|---|---|---|---|
| | Peak p1 | | Peak q1 | | | | | | |
| Sample No | Position | Half width wp | Position | Half width wq | p1 − q1 difference | Peak p2 Position | Peak q2 Position | p2 − q2 difference | p2 − p1 difference | q2 − q1 difference |
| 9 | 420.0 | 4.8 | 421.0 | 4.9 | −1.0 | 420.0 | 421.0 | −1.0 | 0.0 | 0.0 |
| 10 | 418.0 | 4.6 | 418.0 | 4.5 | 0.0 | 418.0 | 418.0 | 0.0 | 0.0 | 0.0 |

TABLE 4

| | Orientation coefficient Tc of Al$_2$O$_3$ layer | | | | | | | |
|---|---|---|---|---|---|---|---|---|
| | Tc(116) | | Tc(104) | | Tc(110) | | Tc(012) | |
| Sample No | Base body-side | Surface-side | Base body-side | Surface-side | Base body-side | Surface-side | Base body-side | Surface-side |
| 1 | 0.4 | 0.9 | 0.7 | 2.5 | 1.4 | 0.6 | 1.3 | 0.4 |
| 2 | 0.5 | 1.5 | 1.1 | 2.8 | 1.1 | 0.3 | 1.1 | 0.8 |
| 3 | 0.3 | 1.1 | 0.5 | 2.7 | 1.5 | 0.6 | 1.7 | 0.6 |
| 4 | 0.7 | 1.8 | 1.7 | 2.9 | 1.0 | 0.3 | 1.0 | 0.3 |
| 5 | 0.5 | 0.8 | 0.8 | 1.9 | 1.2 | 0.9 | 1.5 | 0.6 |
| 6 | 0.7 | 0.3 | 0.7 | 0.5 | 1.1 | 0.9 | 1.0 | 2.5 |
| 7 | 0.7 | 0.3 | 0.7 | 0.4 | 1.1 | 2.3 | 1.2 | 0.9 |
| 8 | 0.4 | 0.4 | 0.6 | 2.5 | 1.2 | 0.6 | 1.0 | 1.3 |
| 9 | 0.6 | 0.6 | 0.7 | 2.1 | 1.4 | 0.7 | 1.2 | 1.4 |
| 10 | 0.8 | 0.9 | 1.0 | 2.5 | 6.1 | 0.9 | 1.3 | 1.4 |

TABLE 5

| | Surface-side XRD of Al$_2$O$_3$ layer | | Cutting performance | | |
|---|---|---|---|---|---|
| Sample No | Storongest peak | Second strongest peak | Crater wear width Kb(mm) | Flank wear width Vb(mm) | Number of impacts (Times) |
| 1 | (104) | (110) | 0.26 | 0.18 | 2700 |
| 2 | (104) | (116) | 0.15 | 0.12 | 3600 |
| 3 | (104) | (116) | 0.19 | 0.14 | 3100 |
| 4 | (104) | (116) | 0.16 | 0.13 | 3700 |
| 5 | (104) | (116) | 0.24 | 0.16 | 2700 |
| 6 | (012) | (113) | 0.23 | 0.20 | 2650 |
| 7 | (110) | (012) | 0.22 | 0.20 | 2600 |
| 8 | (104) | (012) | 0.38 | 0.28 | 2500 |
| 9 | (104) | (110) | 0.45 | 0.30 | 2300 |
| 10 | (012) | (104) | 0.40 | 0.40 | 2400 |

The results of Tables 1 to 5 show the following. That is, in each of Sample Nos. 8 and 10 in which p1 and q1 were located at the same wavenumber, and Sample No. 9 in which q1 was located at a wavenumber on a higher angle side than p1, micro chipping was liable to occur and wear progressed quickly, and the aluminum oxide layer was liable to peel off due to the impacts.

In Samples Nos. 1 to 7 according to the present invention, the micro chipping of the aluminum oxide layer was reduced, and little or no peeling-off occurred. In particular, in Samples Nos. 1 to 5 in which a difference between the wavenumber of the peak q1 and the wavenumber of the peak p1 was 1.0-3.0 cm$^{-1}$, wear was particularly reduced, and the number of impacts until a fracture occurred was large. In Samples Nos. 2 to 4 in which the half width wq was smaller than the half width wp, wear was further reduced, and the number of impacts was large.

In Samples Nos. 1 to 5 in which the surface side Tc (116) in the XRD surface-side peak was larger than the base body side Tc (116) in the XRD base body-side peak, wear was reduced, and the number of impacts until a fracture occurred was large. In particular, in Samples Nos. 1 to 5 in which I(104) was the strongest and I(116) was the second strongest, wear was particularly reduced, and the number of impacts until a fracture occurred was large.

In Samples Nos. 2 to 5 in which the peak q1 was located at a wavenumber on the lower angle side than the peak q2, wear was reduced, and the number of impacts until a fracture occurred was large. In Samples Nos. 2 to 5 in which a difference between the wavenumber of the peak q1 and the wavenumber of the peak q2 was 0.5-3.0 cm$^{-1}$, wear was reduced, and the number of impacts until a fracture occurred was large. In Samples Nos. 1 to 7 in which the peak q2 was located at a wavenumber on the lower angle side than the peak p2, and a difference between the wavenumber of the peak p2 and the wavenumber of the peak q2 was 0.5-3.0 cm$^{-1}$, wear was reduced, and the number of impacts until a fracture occurred was large. In Samples Nos. 1 to 5 in which the peak p1 was located at a wavenumber on the lower angle side than the peak p2, and a difference between the wavenumber of the peak p1 and the wavenumber of the peak p2 was less than 1.0 cm$^{-1}$, wear was reduced, and the number of impacts until a fracture occurred was large.

DESCRIPTION OF THE REFERENCE NUMERAL 1 cutting tool
2 rake surface
3 flank surface
4 cutting edge
5 base body
6 coating layer
7 lower later
8 titanium carbonitride layer
8a MT-titanium carbonitride layer
8b HT-titanium carbonitride layer 9 intermediate layer
9a lower intermediate layer
9b upper intermediate layer
10 aluminum oxide layer
11 surface layer

The invention claimed is:

1. A coated tool, comprising:
a base body; and
a coating layer located on a surface of the base body,
wherein the coating layer comprises at least a titanium carbonitride layer and an aluminum oxide layer having an α-type crystal structure, and the titanium carbonitride layer is located closer to the base body than the aluminum oxide layer, and
wherein, of peaks related to $Al_2O_3$ appearing in a wavenumber range of 416-425 $cm^{-1}$ (around 420 $cm^{-1}$) of a Raman spectrum obtainable by irradiating an Ar laser beam having a wavelength of 514.53 nm to the aluminum oxide layer in a cross section of the coated tool, a base body-side peak to be detected by measurement at a base body-side portion of the aluminum oxide layer is taken as "p", and a surface-side peak to be detected by measurement at a surface-side portion of the aluminum oxide layer is taken as "q", and, when a comparison is made between "p" and "q", the peak "q" is located at a wavenumber on a lower angle side than the peak "p".

2. The coated tool according to claim 1, wherein a difference between a wavenumber of the peak "q" and a wavenumber of the peak "p" is 1.0-3.0 $cm^{-1}$.

3. The coated tool according to claim 1, wherein a half width wq of the peak "q" is smaller than a half width wp of the peak "p".

4. The coated tool according to claim 1, wherein, when an XRD base body-side peak to be detected by measurement at the base body-side portion of the aluminum oxide layer is compared with an XRD surface-side peak to be detected by measurement at the surface-side portion of the aluminum oxide layer in an X-ray diffraction analysis, in terms of orientation coefficient Tc (116) of the aluminum oxide layer expressed by a following general formula Tc (hid), a surface-side Tc (116) in the XRD surface-side peak is larger than a base body-side Tc (116) in the XRD base body-side peak, Orientation Coefficient Tc(hkl)={I(hkl)/$I_0$(hkl)}/[(1/7)×Σ{I(HKL)/$I_0$(HKL)}], wherein
(HKL) denotes seven planes of (012), (104), (110), (113), (024), (116), and (124),
(hkl) denotes any one of (012), (104), (110), (113), (024), (116), and (124),
I(HKL) and I(hkl) denote peak intensity of peak related to each crystal plane detected in an X-ray diffraction analysis of the aluminum oxide layer, and
$I_0$(HKL) and $I_0$(hkl) denote standard diffraction intensity of each crystal plane described on JCPDS card No. 46-1212.

5. The coated tool according to claim 4, wherein one of I(104) and I(116) is a strongest and the other of I(104) and I(116) is a second strongest in the XRD surface-side peak.

6. A cutting tool, comprising:
a rake surface;
a flank surface; and
a cutting edge located along an intersecting ridge of the rake surface and the flank surface,
wherein at least the rake surface is located on the coating layer of the coated tool according to claim 1, and
wherein, when the surface-side peak at a position being 100 μm away from the cutting edge of the rake surface is taken as q1, and the surface-side peak at a position being within 10 μm from the cutting edge of the rake surface is taken as q2, the peak q1 is located at a wavenumber on a lower angle side than the peak q2.

7. The cutting tool according to claim 6, wherein a difference between a wavenumber of the peak q1 and a wavenumber of the peak q2 is 0.5-3.0 $cm^{-1}$.

8. The cutting tool according to claim 6,
wherein, when the base body-side peak at a position being within 10 μm from the cutting edge of the rake surface is taken as p2, the peak q2 is located on a lower angle side than the peak p2, and
wherein a difference between a wavenumber of the peak p2 and a wavenumber of the peak q2 is 0.5-3.0 $cm^-$.

9. The cutting tool according to claim 8,
wherein, when the base body-side peak at a position being 100 μm away from the cutting edge of the rake surface is taken as p1, the peak p1 is located on a lower angle side than the peak p2, and
wherein a difference between a wavenumber of the peak p1 and a wavenumber of the peak p2 is less than 1.0 $cm^{-1}$.

* * * * *